United States Patent
Wang et al.

(10) Patent No.: US 11,237,215 B2
(45) Date of Patent: Feb. 1, 2022

(54) METHOD FOR DETERMINING FAST CHARGE PERFORMANCE OF A NEGATIVE ELECTRODE PLATE AND METHOD FOR DESIGNING A NEGATIVE ELECTRODE PLATE

(71) Applicant: Contemporary Amperex Technology Co., Limited, Ningde (CN)

(72) Inventors: Jiazheng Wang, Ningde (CN); Meng Kang, Ningde (CN); Xiaobin Dong, Ningde (CN); Yuliang Shen, Ningde (CN); Libing He, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 190 days.

(21) Appl. No.: 16/816,230

(22) Filed: Mar. 11, 2020

(65) Prior Publication Data
US 2021/0055349 A1 Feb. 25, 2021

(30) Foreign Application Priority Data
Aug. 23, 2019 (CN) .......................... 201910785259.4

(51) Int. Cl.
| | | |
|---|---|---|
| *G01R 31/367* | (2019.01) | |
| *G01R 31/385* | (2019.01) | |
| *H01M 10/42* | (2006.01) | |
| *H01M 4/02* | (2006.01) | |

(52) U.S. Cl.
CPC ......... *G01R 31/367* (2019.01); *G01R 31/385* (2019.01); *H01M 10/4285* (2013.01); *H01M 2004/027* (2013.01)

(58) Field of Classification Search
CPC .............. G01R 31/367; G01R 31/385; H01M 10/4285; H01M 2004/027; H01M 10/052; H01M 4/133; H01M 4/134; H01M 4/587; H01M 4/0404; H01M 2004/021; H01M 10/44; H01M 4/13; H01M 4/139; H01M 10/0525; C01P 2004/61; C01P 2006/10; Y02E 60/10
See application file for complete search history.

(56) References Cited

U.S. PATENT DOCUMENTS

| 10,700,344 B2* | 6/2020 | Kang .................... H01M 4/587 |
| 2012/0068109 A1 | 3/2012 | Shi |
| 2019/0348678 A1* | 11/2019 | Peng .................... H01M 4/583 |
| 2020/0006765 A1* | 1/2020 | Tan ........................ H01M 4/131 |
| 2020/0362516 A1* | 11/2020 | Afshari ................. D21H 15/10 |
| 2020/0381688 A1* | 12/2020 | Song ................. H01M 10/0525 |
| 2021/0257618 A1* | 8/2021 | Ogi ........................ H01G 11/78 |

FOREIGN PATENT DOCUMENTS

| CN | 105449162 A | 3/2016 |
| CN | 107046125 A | 8/2017 |
| CN | 108140810 A | 6/2018 |
| CN | 108808072 A | 11/2018 |
| CN | 108878892 A | 11/2018 |
| CN | 109585781 A | 4/2019 |
| CN | 109638212 A | 4/2019 |
| CN | 109802088 A | 5/2019 |
| CN | 109920984 A | 6/2019 |
| CN | 110010903 A | 7/2019 |
| EP | 2306559 A1 | 4/2011 |
| WO | 2019124425 A1 | 6/2019 |

OTHER PUBLICATIONS

Yang (strategies to improve the electrochemical performance of electrodes for li-ion batteries) (Year: 2012).*
Chen et al. (Large-Strain Deformation Mechanics of Charge-Containing Polymer Membranes,) (Year: 2018).*
The First Office Action for Chinese Application No. 201910785259. 4, dated Jul. 16, 2021, 7pages.
The extended European search report for EP Application No. 20163290.8, dated Aug. 18, 2020, 11 pages.

* cited by examiner

*Primary Examiner* — Mohammad K Islam
(74) *Attorney, Agent, or Firm* — Law Offices of Liaoteng Wang

(57) ABSTRACT

The present application provides a method for determining fast charge performance of a negative electrode plate and a method for designing a negative electrode plate. By utilizing the method(s) according to the present application, the charging speed of a negative electrode plate can be quickly evaluated and the design period of a negative electrode plate in a fast charge battery can be greatly shortened.

15 Claims, No Drawings

METHOD FOR DETERMINING FAST CHARGE PERFORMANCE OF A NEGATIVE ELECTRODE PLATE AND METHOD FOR DESIGNING A NEGATIVE ELECTRODE PLATE

CROSS-REFERENCE TO RELATED APPLICATION

This application claims priority to Chinese Patent Application No. 201910785259.4 filed on Aug. 23, 2019, which is incorporated herein by reference in its entirety.

TECHNICAL FIELD

This application belongs to the field of a battery, and particularly refers to a method for designing a negative electrode plate in a fast charge battery.

BACKGROUND

In contrast to traditional fuel vehicles, electric vehicles have a long charging time as one of the biggest disadvantages. Usually, an electric vehicle has a charging time of more than ten hours, which severely limits the application of electric vehicles. As a result, in the development of electric vehicles to overtake and replace traditional fuel vehicles, one of the key technical problems to be overcome is how to increase charging speed. Low charging speed is also an important indicator that affects user experience.

In a particular power battery system, a key factor in determining charging speed is negative electrode plate. However, fast charge performance of a negative electrode plate is affected by many technical parameters that interact with each other and restrict each other. In consequence, in order to obtain a negative electrode plate that matches with a specific power battery system, battery designers often spend a lot of time adjusting various technical parameters of negative electrode plate and repeatedly performing experiments to verify the effects. This leads to a long battery designing and development cycle, especially for custom batteries with special requirements for fast charge speed.

Therefore, an urgent problem in the art is how to quickly design a negative electrode plate in a fast charge battery.

SUMMARY

In view of the existing problems in the art, an object of the present application is to provide a method for designing a negative electrode plate, so that the design period of a negative electrode plate in a fast charge battery can be greatly shortened.

In order to achieve the above object, the present application provides a method for determining fast charge performance of a negative electrode plate, the method comprising:
  determining fast charge performance of the negative electrode plate according to an empirical formula $A=CW*(PD-1)*(OI+D50+D90)/(w*100)$, wherein:
    in case $A \leq 16$, the negative electrode plate is applicable to a fast charge battery at a constant current rate of 10 C or higher;
    in case $16 < A \leq 85$, the negative electrode plate is applicable to a fast charge battery at a constant current rate of 4 C-10 C;
    in case $85 < A \leq 110$, the negative electrode plate is applicable to a fast charge battery at a constant current rate of 2 C-4 C; and
    in case $A > 110$, the negative electrode plate is applicable to a fast charge battery at a constant current rate of lower than 2 C;
  and in the empirical formula,
    CW represents the coating weight on the negative electrode plate, expressed in $mg/cm^2$;
    PD represents the press density of coating on the negative electrode plate, expressed in $g/cm^3$;
    OI represents the orientation index of the negative electrode plate;
    D50 represents the particle size which corresponds to 50% of the cumulative volume percentage of negative active material in the negative electrode plate, expressed in μm;
    D90 represents the particle size which corresponds to 90% of the volume distribution of negative active material in the negative electrode plate, expressed in μm; and
    w represents the mass percentage of active carbon atoms in the negative active material of the negative electrode plate, relative to the mass of the negative active material; and
    the negative active material in the negative electrode plate fulfills the conditions that w is from 1% to 10% (preferably from 1.6% to 4%) and D50 is from 5 μm to 15 μm (preferably from 6 μm to 13 μm).

By utilizing the above method, the fast charge performance of a negative electrode plate can be evaluated simply and quickly, thereby saving time and simplifying the method for designing a battery.

In another aspect, the present application provides a method for designing a negative electrode plate in a fast charge battery, the method comprising:
  I) screening a negative active material for a fast charge battery, comprising:
    (1) determining the mass percentage w of active carbon atoms in the negative active material;
    (2) determining the particle size D50 which corresponds to 50% of the cumulative volume percentage of the negative active material, expressed in μm;
    (3) determining the particle size D90 which corresponds to 90% of the volume distribution of the negative active material, expressed in m; and
    (4) selecting the negative active material in which the mass percentage w is from 1% to 10% (preferably from 1.6% to 4%) and D50 is from 5 μm to 15 μm (preferably from 6 m to 13 μm);
  II) determining the process parameters of the negative electrode plate, comprising:
    (i) dispersing the negative active material obtained from the above screening and an optional auxiliary agent in a solvent to form a uniform negative electrode slurry, followed by coating a negative electrode current collector with the negative electrode slurry, and after drying the coated negative electrode plate, determining the coating weight CW of the negative electrode plate, expressed in $mg/cm^2$; and
    (ii) cold pressing the negative electrode plate obtained from step (i), followed by determining the press density PD of coating on the negative electrode plate (in $g/cm^3$) and the orientation index OI value of the negative electrode plate; and
  III) determining fast charge performance of the negative electrode plate, comprising:
    determining rate performance of a fast charge battery to which the negative electrode plate is applicable according to the following empirical formula $A=CW*(PD-1)*(OI+D50+D90)/(w*100)$, wherein:
in case A≤16, the negative electrode plate is applicable to a fast charge battery at a constant current rate of 10 C or higher;
in case 16<A≤85, the negative electrode plate is applicable to a fast charge battery at a constant current rate of 4 C-10 C;
in case 85<A≤110, the negative electrode plate is applicable to a fast charge battery at a constant current rate of 2 C-4 C; and
in case A>110, the negative electrode plate is applicable to a fast charge battery at a constant current rate of lower than 2 C.

By utilizing the above method for designing a negative electrode plate in a fast charge battery, the development cycle of a fast charge battery can be greatly shorten.

DETAILED DESCRIPTION

The present application will be specifically described below in conjunction with the embodiments.

Definition

As used herein, "a," "an," "the," "at least one," and "one or more" are used interchangeably, unless indicated otherwise. Unless otherwise indicated herein, the use of the singular forms herein is also intended to include the plural forms.

In the description of the present application, it is to be noted that "above" and "below" are inclusive of the number itself, and "more" in "one or more" means two or more.

Throughout the present disclosure, where compositions are described as having, including, or comprising specific components, or where processes are described as having, including, or comprising specific process steps, it is contemplated that the compositions or processes as disclosed herein may further comprise other components or steps, whether or not specifically mentioned in this disclosure, but also it is contemplated that the compositions or processes may consist essentially of, or consist of, the recited components or steps.

For the sake of brevity, only certain numerical ranges are explicitly disclosed herein. However, any lower limit may be combined with any upper limit to form a range that is not explicitly described; and any lower limit may be combined with other lower limits to form an unspecified range, and any arbitrary upper limit may be combined with any other upper limit to form an unspecified range. Further, although not explicitly stated, each point or single value between the endpoints of the range is included in the range. Thus, each point or single value can be combined with any other point or single value or combined with other lower or upper limits to form a range that is not explicitly recited.

The terms "preferred" and "preferably" refer to embodiments of the application that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the application.

In the present application, D90 of negative active material refers to the particle size which corresponds to 90% of the cumulative volume percentage of the negative active material. D50 refers to a volume distribution median particle size, i.e. the particle size corresponding to 50% of the cumulative volume percentage of the negative active material. Both D90 and D50 are expressed in m. For example, the particle size distribution can be measured using a laser diffraction particle size distribution measuring instrument (such as Mastersizer 3000). D90 and D50 can be obtained from the particle size distribution.

In the present application, OI value of a negative electrode plate refers to orientation index of active material in the negative electrode plate, and is used to characterize the anisotropy degree of the active material in the electrode plate. The orientation index OI value can generally be calculated from an X-ray diffraction spectrum measured by using an X-ray powder diffractometer (for example, X'pert PRO) according to the $OI=C_{004}/C_{110}$, wherein $C_{004}$ is the peak area of the 004 characteristic diffraction peak and $C_{110}$ is the peak area of the $_{110}$ characteristic diffraction peak.

In the present application, CW represents the coating weight on the negative electrode plate, i.e. the weight of coating per unit area on the electrode plate after cold pressing, expressed in $mg/cm^2$. CW can be measured according to the method described in the examples, or can be measured according to other methods known in the art.

In the present application, PD represents the press density of coating on the negative electrode plate, i.e. the density of the coating film after cold pressing, expressed in $g/cm^3$. PD can be calculated, for example, according to the formula: the press density PD of coating=the coating weight CW of the negative electrode plate/the thickness of coating on the negative electrode plate.

In the present application, w represents the mass percentage of active carbon atoms in negative active material. A commonly used negative active material is graphite, which is composed of carbon atoms. However, for different kinds of graphites, activity of graphite will vary due to the different degrees of crystallinity (graphitization degree), different morphologies (for example, flaky particles, spherical particles, large particles, and small particles) and the like of graphite. Even for the same graphite particles, carbon atoms also have strong or weak activity, due to different positions of carbon atoms in the graphite particles (for example, the carbon atoms on the surface have unpaired electrons, and are more active than the carbon atoms within the body of graphite). In a battery, the activity of carbon atoms in a negative active material is expressed as a difference in resistance. For a negative active material, a larger number of active carbon atoms have smaller resistance in charge transfer necessary for electrochemical reaction; and carbon atoms with higher activity are more favorable for fast charge. From a view of chemical principles, an active carbon atom represents a carbon atom having a strong ability to lose electrons, that is, a highly reductive carbon atom. In the present application, w is defined as the mass percentage of active carbon atoms in the negative active material of the negative electrode plate, relative to the mass of the negative active material. Usually, w can be measured by the following method: oxidizing negative active material by oxidant $CO_2$ at a high temperature under a protective gas atmosphere, measuring the weight loss rate of the negative active material (weight loss is exhibited with the oxidation of active carbon atoms in the negative active material by $CO_2$), and calculating w based on the weight loss rate. It is worth noting that in the preparation of a negative electrode plate, the current collector can be coated on both sides or on one side. When the negative electrode current collector is coated on both sides, the parameters OI, CW, and PD are measured for one single-side negative layer.

In one aspect, the present application provides a method for determining fast charge performance of a negative electrode plate, the method comprising:

determining fast charge performance of the negative electrode plate according to an empirical formula $A=CW*(PD-1)*(OI+D50+D90)/(w*100)$, wherein:

in case $A \le 16$, the negative electrode plate is applicable to a fast charge battery at a constant current rate of 10 C or higher;

in case $16 < A \le 85$, the negative electrode plate is applicable to a fast charge battery at a constant current rate of 4 C-10 C (i.e. 4 C or higher and lower than 10 C);

in case $85 < A \le 110$, the negative electrode plate is applicable to a fast charge battery at a constant current rate of 2 C-4 C (i.e. 2 C or higher and lower than 4 C); and in case $A > 110$, the negative electrode plate is applicable to a fast charge battery at a constant current rate of lower than 2 C;

and in the empirical formula,

CW represents the coating weight on the negative electrode plate, expressed in $mg/cm^2$;

PD represents the press density of coating on the negative electrode plate, expressed in $g/cm^3$;

OI represents the orientation index of the negative electrode plate;

D50 represents the particle size which corresponds to 50% of the cumulative volume percentage of negative active material in the negative electrode plate, expressed in μm;

D90 represents the particle size which corresponds to 90% of the volume distribution of negative active material in the negative electrode plate, expressed in μm; and w represents the mass percentage of active carbon atoms in negative active material of the negative electrode plate, relative to the mass of the negative active material.

It has been found that when the negative active material in a negative electrode plate fulfills the conditions that w is from 1% to 10% (preferably from 1.6% to 4%) and D50 is from 5 μm to 15 μm (preferably from 6 m to 13 μm), the fast charge performance of a negative electrode plate be evaluated simply and quickly by utilizing the above empirical formula, thereby saving time and simplifying the method for designing a battery.

In another aspect, the present application provides a method for designing a negative electrode plate in a fast charge battery, the method comprising:

I) screening a negative active material for a fast charge battery, comprising:
(1) determining the mass percentage w of active carbon atoms in the negative active material;
(2) determining the median particle size D50 which corresponds to 50% of the cumulative volume percentage of the negative active material, expressed in m;
(3) determining the particle size D90 which corresponds to 90% of the volume distribution of the negative active material, expressed in μm; and
(4) selecting the negative active material in which the mass percentage w is from 1% to 10% (preferably from 1.6% to 4%) and D50 is from 5 μm to 15 μm (preferably from 6 μm to 13 μm);

II) determining the process parameters of the negative electrode plate, comprising:

(i) dispersing the negative active material obtained from the above screening and an optional auxiliary agent in a solvent to form a uniform negative electrode slurry, followed by coating a negative electrode current collector with the negative electrode slurry, and after drying the coated negative electrode plate, determining the coating weight CW of the negative electrode plate, expressed in $mg/cm^2$; and (ii) cold pressing the negative electrode plate obtained from step (i), followed by determining the press density PD of coating on the negative electrode plate (in $g/cm^3$) and the orientation index OI value of the negative electrode plate; and III) determining fast charge performance of the negative electrode plate, comprising:

determining rate performance of a fast charge battery to which the negative electrode plate is applicable according to the following empirical formula $A=CW*(PD-1)*(OI+D50+D90)/(w*100)$, wherein:

in case $A \le 16$, the negative electrode plate is applicable to a fast charge battery at a constant current rate of 10 C or higher;

in case $16 < A \le 85$, the negative electrode plate is applicable to a fast charge battery at a constant current rate of 4 C-10 C (i.e. 4 C or higher and lower than 10 C);

in case $85 < A \le 110$, the negative electrode plate is applicable to a fast charge battery at a constant current rate of 2 C-4 C (i.e. 2 C or higher and lower than 4 C); and in case $A > 110$, the negative electrode plate is applicable to a fast charge battery at a constant current rate of lower than 2 C.

Those skilled in the art will understand that in the above screening steps, the steps of determining D50, D90, and W can be performed in any order; and in the step of determining the process parameters of the negative electrode plate, it is generally necessary to proceed in the order given above.

The method for designing a negative electrode plate in a fast charge battery according to the present application optionally further comprises the step of:

IV) changing performance parameters of the negative active material and/or the process parameters of the negative electrode plate to adjust A value, so that the ratio performance of the negative electrode plate meets design requirements. Obviously, the value of empirical formula A can be adjusted by changing one or more of CW, PD, OI, D50, and D90, so that the resulting negative electrode plate can have the desired rate performance (fast charge performance).

By utilizing the above method for designing a negative electrode plate in a fast charge battery, the development cycle of a fast charge battery can be greatly shorten.

The designing method of the present application is applicable to various carbon-containing negative active materials. Specifically, the negative active material of the negative electrode plate usually comprises one or more of artificial graphite and natural graphite, and preferably further comprises one or more of soft carbon, hard carbon, and silicon-based material. These materials are commonly used as negative active materials in the field of battery and are commercially available. In an embodiment in which the negative active material is a mixture, the weight percentage of graphite material (artificial graphite and natural graphite)

in the negative active material is generally higher than 50%, preferably higher than 600, 65%, 70%, 75%, 80%, 85%, 90% or 95%.

In some preferred embodiments, in step I), the selected negative active material further has a D90 of from 8 μm to 23 μm, preferably from 10 μm to 18 μm.

In some preferred embodiments, in step I), the selected negative active material further has a tap density TD of from 0.9 to 1.2 g/cm$^3$, preferably from 0.95 to 1.1 g/cm$^3$.

In some preferred embodiments, in step II), the coating weight CW of the negative electrode plate is further controlled in the range of from 5 mg/cm$^2$ to 13 mg/cm$^2$. Preferably, CW is from 8 mg/cm$^2$ to 12 mg/cm$^2$, more preferably from 8.4 mg/cm$^2$ to 11.1 mg/cm$^2$.

In some preferred embodiments, in step II), the press density PD of coating on the negative electrode plate is further controlled in the range of from 1.4 g/cm$^3$ to 1.65 g/cm$^3$, more preferably from 1.4 g/cm$^3$ to 1.55 g/cm$^3$.

In some preferred embodiments, in step II), the orientation index OI value of the negative electrode plate is further controlled in the range of from 8 to 30, more preferably from 12 to 24.

For example, in a preferred embodiment, the method for designing a negative electrode plate in a fast charge battery according to the present application may comprise the following steps:

I) screening a negative active material for a fast charge battery, comprising:
  (1) first, determining the mass percentage w of active carbon atoms in the negative active material, and selecting active material having a mass percentage w of active carbon atoms in the negative active material of from 1% to 10%, more preferably from 1.6% to 4%;
  (2) second, determining the median particle size D50 of the negative active material, and selecting active material having a median particle size D50 of from 5 μm-15 μm more preferably 6 μm-13 μm;
  (3) third, determining the particle size D90 of the negative active material, and preferably selecting active material having a particle size D90 of from 8 μm to 23 μm, more preferably from 10 μm to 18 μm; and
  (4) fourth, determining the tap density TD of the negative active material, and preferably selecting active material having a tap density TD of from 0.9 to 1.2, more preferably from 0.95 to 1.1;
in the above screening step, the first step and the second step are essential steps and conditions for negative active material in a fast charge battery; and other steps and conditions can be selectively conducted with the proviso of the first step and the second step;

II) designing the parameters of the negative electrode plate and evaluating the performance, comprising:
  (i) dispersing the negative active material obtained from the above screening and an auxiliary agent (such as a conductive additive, a binder and the like) in a solvent (such as deionized water) in a certain mass ratio to form a uniform negative electrode slurry; followed by coating a negative electrode current collector copper foil with the negative electrode slurry, and drying the coated negative electrode plate; preferably controlling the coating weight CW of the negative electrode plate in a range of from 5 mg/cm$^2$ to 13 mg/cm$^2$; more preferably, CW is from 8 mg/cm$^2$ to 12 mg/cm$^2$, most preferably from 8.4 mg/cm$^2$ to 11.1 mg/cm$^2$;
  (ii) cold pressing the negative electrode plate obtained from step (i); preferably controlling the press density PD of coating on the negative electrode plate and the orientation index OI value of the negative electrode plate, to obtain the negative electrode plate; preferably controlling PD in the range of from 1.4 g/cm$^3$ to 1.65 g/cm$^3$, more preferably from 1.4 g/cm$^3$ to 1.55 g/cm$^3$; preferably controlling the OI value of the negative electrode plate in the range of from 8 to 30, more preferably from 12 to 24;

III) determining rate performance of a fast charge battery to which the designed negative electrode plate is applicable according to the following empirical formula $A=CW*(PD-1)*(OI+D50+D90)/w/100$;
  in case $A \leq 16$, the negative electrode plate is applicable to a fast charge battery at a constant current rate of 10 C or higher;
  in case $16 < A \leq 85$, the negative electrode plate is applicable to a fast charge battery at a constant current rate of 4 C-10 C;
  in case $85 < A \leq 110$, the negative electrode plate is applicable to a fast charge battery at a constant current rate of 2 C-4 C; and
  in case $A > 110$, the negative electrode plate is applicable to a fast charge battery at a constant current rate of lower than 2 C;
  in the above steps for designing parameters, A value is an essential requirement; and other parameters can be selectively met with the proviso of A value.

In the above method for designing a negative electrode plate in a fast charge battery, when some parameters of the negative active material or the negative electrode plate do not fall within the preferred ranges, the effects of said parameters on the fast charge performance can be compensated by adjusting other parameters. For example, when the particle size D50 of the negative active material is too large, same rate performance of the negative electrode plates can be achieved by adjusting w, CW, PD, and the like, under the premise that other process parameters are fixed.

The traditional steps of designing a negative electrode plate include: (i) selecting negative active material according to requirements of battery core, (ii) calculating and adjusting the parameters of the negative electrode plate, (iii) assembling a battery, (iv) measuring battery performance, (v) adjusting the parameters, (vi) assembling a battery again and measuring parameters. Compared with the traditional steps of designing a negative electrode plate, the method for designing a negative electrode plate according to the present application eliminates the tedious and time-consuming process comprising experimental steps such as assembling a battery, measuring the rate performance and the like. In the method for designing a negative electrode plate according to the present application, fast charge performance of a battery can be predicted by simply calculating a set of process parameters, thereby greatly shortening the development cycle of a fast charge battery and significantly saving costs. Especially for various performance requirements of different customers, a qualified battery product can be designed in a short time, thereby greatly saving the development cost of customized battery products and improving the response speed to customer's needs.

The negative electrode plate designed by the method according to the present application can be applied to various secondary batteries. Constructions and preparation methods of these secondary batteries are known per se. Generally, a secondary battery is mainly composed of a negative electrode plate, a positive electrode plate, a separator, and an electrolyte. The positive electrode plate and negative electrode plate are immersed in the electrolyte. Active ions move between the positive electrode plate and the negative electrode plate via electrolyte as a medium, to achieve charge and discharge of the battery. In order to avoid short circuit between the positive electrode plate and negative electrode plate through the electrolyte, it is necessary to separate the positive electrode plate from negative electrode plate by using a separator. A secondary battery may have a shape of, for example, a square or cylindrical hard shell (for example, an aluminum shell) as outer package, or may have a soft pack (for example, an aluminum plastic film) as outer package.

The secondary battery may be a lithium ion battery, a sodium ion battery, or the like. Preferably, the method for designing a negative electrode plate according to the present application is particularly suitable for designing a negative electrode plate in a lithium ion secondary battery.

When the battery is a lithium ion battery, the positive electrode plate in the battery comprises a positive electrode current collector and a positive electrode layer disposed on a surface of the positive electrode current collector, wherein the positive electrode layer comprises a positive active material. The positive active material may be selected from lithium iron phosphate, lithium cobalt oxide, lithium nickel oxide, lithium manganese oxide, lithium nickel manganese oxide, lithium nickel cobalt manganese oxide, lithium nickel cobalt aluminum oxide, transition metal phosphate, etc. However, the present application is not limited to these materials, and other conventionally known materials that can be used as a positive active material in a lithium ion battery may also be used. These positive active materials may be used alone or in combination of two or more.

In the secondary battery to which the present application is applied, the particular types and the constitution of the separator and the electrolyte are not specifically limited, and may be selected depending on the actual needs.

Specifically, the separator may be selected from a polyethylene layer, a polypropylene layer, a polyvinylidene fluoride layer, and a multilayer composite layer thereof.

Specifically, when the battery is a lithium ion battery, as non-aqueous electrolyte, a solution of lithium salt dissolved in an organic solvent is generally used. Lithium salt is an inorganic lithium salt, such as $LiClO_4$, $LiPF_6$, $LiBF_4$, $LiAsF_6$, $LiSbF_6$ and the like, or an organic lithium salt, such as $LiCF_3SO_3$, $LiCF_3CO_2$, $Li_2C_2F_4(SO_3)_2$, $LN(CF_3SO_2)_2$, $LiC(CF_3SO_2)_3$, $LiC_nF_{2n+1}SO_3$ (n≥2). The organic solvent used in non-aqueous electrolyte is a cyclic carbonate, such as ethylene carbonate, propylene carbonate, butylene carbonate, vinylene carbonate and the like; a chain-like carbonate, such as dimethyl carbonate, diethyl carbonate, methyl ethyl carbonate and the like; a chain-like ester, such as methyl propionate and the like; a cyclic ester, such as γ-butyrolactone and the like; a chain-like ether, such as dimethoxyethane, diethyl ether, diethylene glycol dimethyl ether, triethylene glycol dimethyl ether and the like; a cyclic ether, such as tetrahydrofuran, 2-methyltetrahydrofuran and the like; a nitrile, such as acetonitrile, propionitrile and the like; or a mixture of these solvents.

The preparation methods and configurations of the secondary batteries are well known in the art and will not be specifically repeated for the sake of clarity.

Hereafter, advantageous effects of the present application will be further described in conjunction with the examples.

EXAMPLES

The present disclosure is further described in the following examples that are intended as illustrations only, since various modifications and changes will be apparent to those skilled in the art from the scope of the present application. Unless otherwise indicated, all parts, percentages, and ratios reported in the following examples are on a weight basis and all reagents used in the examples are commercially available or synthetically obtained by conventional methods, and may be used without further treatment. The instruments used in the following examples are commercially available, unless otherwise specified.

1. Preparation of the Batteries for Testing

Unless otherwise specified, the batteries in the respective examples and comparative examples were prepared by the following methods.

1.1 Preparation of Positive Electrode Plate in Lithium Ion Battery

The positive active material lithium nickel cobalt manganese oxides (NCM523, $LiNi_{0.5}Co_{0.2}Mn_{0.3}O_2$), a conductive agent Super P, and a binder (PVDF) were mixed at a weight ratio of 96:2:2 and dissolved in N-methylpyrrolidone (NMP) as solvent. After uniformly mixing, a positive electrode slurry was obtained. Then the positive electrode slurry was uniformly coated on current collector aluminum foil, as a positive active material layer. After drying, the positive active material layer was cold pressed, trimmed, cut, and slit, to give a positive electrode plate of a lithium ion battery.

1.2 Preparation of Negative Electrode Plate in Lithium Ion Battery

Negative electrode plate was prepared as follows. Negative active material artificial graphite, a conductive agent Super-P, a thickener CMC, an adhesive styrene-butadiene rubber (SBR) were mixed at a weight ratio of 96:2:1:1 and dissolved in deionized water as solvent. After uniformly mixing, a negative electrode slurry was obtained. Then the negative electrode slurry was uniformly coated on current collector copper foil, as a negative active material layer. After drying, the negative active material layer was cold pressed, trimmed, cut, and slit, to give a negative electrode plate of a lithium ion battery.

1.3 Preparation of Electrolyte in Lithium Ion Battery

In an argon atmosphere glove box, ethylene carbonate (EC), ethyl methyl carbonate (EMC), and diethyl carbonate (DEC) were mixed at a volume ratio of 1:1:1 to obtain a non-aqueous organic solvent. Then a sufficiently dried lithium hexafluorophosphate ($LiPF_6$) as lithium salt was dissolved into the non-aqueous organic solvent to obtain a solution having a concentration of 1.0 mol/L. After uniformly mixing, an electrolyte was obtained.

1.4 Separator

A 16 μm polyethylene (PE) film was used as a separator.

1.5 Assembly of the Lithium Ion Battery

The positive electrode plate, the separator and the negative electrode plate were stacked in order, so that the separator was sandwiched between the positive negative electrode plate and the negative electrode plate, and then wound to obtain a bare battery cell. The bare battery cell was placed in the outer package. The prepared electrolyte was injected into the dried bare battery cell. After the processing steps including standing, formation, shaping, and the like, a lithium ion secondary battery was obtained.

2. Parameters of Negative Electrode Plate and Tests for Measuring Performance Parameters of Battery In each of the examples and comparative examples, the performance parameters were measured by following methods.

2.1 D90 and D50 of Negative Active Material:

The particle size distribution was measured using a laser diffraction particle size distribution measuring instrument (Malvern Mastersizer 3000) according to the laser diffraction method for measuring particle size distribution in GB/T19077-2016, to obtain D90 and D50.

2.2 Orientation Index OI Value of Negative Electrode Plate:

X-ray diffraction spectrum of negative electrode plate was measured by using X-ray powder diffractometer (X'pert PRO) according to the X-ray diffraction analysis method and the lattice parameter determination method of graphite JIS K 0131-1996, JB/T4220-2011. Then, the orientation index OI value of negative electrode plate was calculated according to the formula $OI=C_{004}/C_{110}$, wherein $C_{004}$ was the peak area of the 004 characteristic diffraction peak and $C_{110}$ was the peak area of the 110 characteristic diffraction peak.

2.3 Coating Weight CW of Negative Electrode Plate:

The mass of coating on negative electrode plate was weighed by a standard balance, and the area of the coating on negative electrode plate was measured by a ruler. Then the mass of coating per unit area on the negative electrode, i.e. the coating weight CW (in mg/cm$^2$) was calculated.

2.4 Press Density PD of Coating on Negative Electrode Plate:

First, the coating weight CW of the negative electrode plate was measured as above mentioned. Then the thickness of coating on negative electrode plate was measured by using a micrometer. The thickness values were measured by taking at least 5 points, followed by calculating the average value. Press density PD of coating on negative electrode plate was calculated according to the formula: the press density PD (in mg/cm$^3$) of coating=the coating weight CW (in mg/cm$^2$) of the negative electrode plate/the thickness (in cm) of coating on the negative electrode plate. Then the value of the press density PD was converted into a value in g/cm$^3$.

2.5 Mass Percentage w of Active Carbon Atoms in Negative Active Material of Negative Electrode Plate:

Active carbon atoms in negative active material were oxidizing by oxidant $CO_2$ at a high temperature under a protective gas atmosphere. The weight loss rate of the negative active material was measured. Then mass percentage of active carbon atoms in the negative active material was calculated relative to the total weight of the negative active material.

Specifically, during the test, the protective gas and $CO_2$ gas were continuously supplied into the U-shaped container containing the negative active material. Then, the reaction vessel is heated from room temperature to 900° C., so that the activated carbon atoms in the negative active material reacted with $CO_2$. The heating rate was 10° C./min or less.

During the test, the protective gas was an inert gas or $N_2$, and the flow rate of the protective gas was 20 ml/min or less, and the flow rate of $CO_2$ gas was 30 ml/min or less.

2.6 Rate Performance of Battery:

At 25° C., the prepared battery was fully charged at x C and fully discharged at 1 C. This process was repeated 10 times. Then the battery was fully charged at x C. Subsequently, the negative electrode plate was disassembled, and the surface of negative electrode plate was observed for the degree of lithium precipitation. If no lithium precipitation was observed on the surface of negative electrode plate, the charging rate x C was increased progressively in increments of 0.1 C and the degree of lithium precipitation was tested again, until lithium precipitation was observed on the surface of negative electrode plate. At this time, the charging rate (x C-0.1 C) was reported as the maximum charging rate of the battery.

The measurement results of parameters of negative electrode plates and the performance parameters of batteries in the respective examples were shown in Table 1.

TABLE 1

| No. | Positive active material | Negative active material | | | Negative electrode plate | | | Value of A as calculated | Rate performance |
|---|---|---|---|---|---|---|---|---|---|
| | | W | D50 (μm) | D90 (μm) | CW (mg/cm$^2$) | PD (g/cm$^3$) | OI | | |
| Ex. 1 | NCM523 | 7.0% | 5.0 | 9 | 6 | 1.3 | 7 | 5.4 | 20C |
| Ex. 2 | NCM523 | 5.4% | 5.0 | 9 | 6.5 | 1.4 | 7 | 10.1 | 15C |
| Ex. 3 | NCM523 | 4.1% | 5.0 | 9 | 6.5 | 1.4 | 7 | 13.3 | 12C |
| Ex. 4 | NCM523 | 3.5% | 5.0 | 9 | 6.5 | 1.4 | 7 | 15.6 | 11C |
| Ex. 5 | NCM523 | 3.5% | 5.0 | 9 | 6.5 | 1.4 | 8 | 16.3 | 9.8C |
| Ex. 6 | NCM523 | 3.5% | 5.0 | 9 | 7 | 1.4 | 8 | 17.6 | 9C |
| Ex. 7 | NCM523 | 3.0% | 6.0 | 11 | 7 | 1.4 | 10 | 25.2 | 8C |
| Ex. 8 | NCM523 | 2.5% | 8.0 | 15 | 7 | 1.4 | 10 | 37.0 | 6C |
| Ex. 9 | NCM523 | 2.5% | 8.0 | 15 | 7 | 1.5 | 10 | 46.2 | 5.5C |
| Ex. 10 | NCM523 | 2.5% | 8.0 | 15 | 7 | 1.5 | 16 | 54.6 | 5C |
| Ex. 11 | NCM523 | 2.5% | 10.5 | 17 | 6.9 | 1.5 | 20 | 65.6 | 4.8C |
| Ex. 12 | NCM523 | 2.5% | 10.5 | 17 | 7.8 | 1.55 | 20 | 81.5 | 4.2C |
| Ex. 13 | NCM523 | 2.4% | 10.5 | 17 | 7.8 | 1.55 | 20 | 84.9 | 3.8C |
| Ex. 14 | NCM523 | 2.3% | 10.5 | 17 | 7.8 | 1.55 | 20 | 88.6 | 3.6C |
| Ex. 15 | NCM523 | 2.1% | 10.5 | 17 | 7.8 | 1.55 | 20 | 97.0 | 2.5C |
| Ex. 16 | NCM523 | 2.5% | 10.5 | 17 | 10.4 | 1.55 | 20 | 108.7 | 2.1C |
| Ex. 17 | NCM523 | 2.5% | 10.5 | 17 | 10.6 | 1.55 | 20 | 110.8 | 1.9C |
| Ex. 18 | NCM523 | 1.5% | 10.5 | 17 | 11 | 1.55 | 20 | 191.6 | 1.7C |
| Ex. 19 | NCM523 | 1.2% | 18.0 | 34 | 9.4 | 1.65 | 22 | 376.8 | 1.2C |
| Ex. 20 | NCM523 | 1.0% | 13.0 | 26 | 11.4 | 1.7 | 16 | 438.9 | 0.8C |

As can be seen from the above table, the rate performance of a battery was closely related to the calculated value of A. In particular, the empirical formula $A=CW*(PD-1)*(OI+D50+D90)/(w*100)$ was indeed capable of being used to predict and characterize the rate performance (i.e. fast charge performance) of the battery comprising corresponding negative electrode plates. Specifically:

in case A≤16, the battery comprising the negative electrode plate had a rate performance (fast charge performance) of 10 C or higher;

in case 16<A≤85, the battery comprising the negative electrode plate had a rate performance (fast charge performance) of 4 C-10 C;

in case 85<A≤110, the battery comprising the negative electrode plate had a rate performance (fast charge performance) of 2 C-4 C; and in case A>110, the battery comprising the negative electrode plate had a rate performance of lower than 2 C; in other words, the negative electrode plate was not applicable to a fast charge battery at a constant current rate of higher than 2 C.

The inventors additionally used other positive active materials and negative active materials to assemble into batteries for verification. The experimental results (not shown) indicated that the relationship between the above empirical formula and rate performance still existed on the premise that the negative electrode active materials with w of from 1% to 10% (preferably from 1.6% to 4%) and D50 of from 5 μm to 15 μm (preferably from 6 μm to 13 μm) were used.

As a result, a person skilled in the art could quickly determine (predict) the fast charge performance of negative electrode plate or quickly design a negative electrode plate, according to the relationship between the above empirical formula and rate performance.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

The invention claimed is:

1. A method for determining fast charge performance of a negative electrode plate, the negative electrode plate comprising a negative active material, a conductive additive, and a binder, characterized in that the method comprises:
   determining fast charge performance of the negative electrode plate according to an empirical formula $A=CW*(PD-1)*(OL-D50+D90)/(w*100)$, wherein:
   in case A<16, the negative electrode plate is applicable to a fast charge battery at a constant current rate of 10 C or higher;
   in case 16<A<85, the negative electrode plate is applicable to a fast charge battery at a constant current rate of 4 C-10 C;
   in case 85<A<110, the negative electrode plate is applicable to a fast charge battery at a constant current rate of 2 C-4 C; and
   in case A>110, the negative electrode plate is applicable to a fast charge battery at a constant current rate of lower than 2 C;
   and in the empirical formula,
   CW represents the coating weight CW of the negative electrode plate, expressed in mg/cm";
   PD represents the press density of coating on the negative electrode plate, expressed in g/cm};
   OI represents the orientation index of the negative electrode plate as measured by using X-ray powder diffractometer according to X-ray diffraction analysis method and lattice parameter determination method of graphite, and calculating according to formula $OI=C004/C110$, wherein C004 was peak area of 004 characteristic diffraction peak and C110 was peak area of 110 characteristic diffraction peak;
   DS50 represents the particle size which corresponds to 50% of the cumulative volume percentage of negative active material in the negative electrode plate, expressed in μm;
   D90 represents the particle size which corresponds to 90% of the cumulative volume percentage of the negative active material in the negative electrode plate, expressed in μm;
   D50 and D90 are measured using a laser diffraction particle size distribution measuring instrument according to the laser diffraction method for measuring particle size distribution; and
   w represents the mass percentage of active carbon atoms in the negative active material of the negative electrode plate, relative to the mass of the negative active material, and w is measured according to the description; and
   wherein the negative active material of the negative electrode plate fulfills the conditions that w is from 1% to 10% and D50 is from 5 μm to 15 μm, and wherein the negative active material of the negative electrode plate comprises one or more of artificial graphite and natural graphite; the weight percentage of graphite material in the negative active material is higher than 90%; and the coating weight CW of the negative electrode plate is further controlled in the range of from 5 mg/cm$^2$ to 13 mg/cm$^2$.

2. The method according to claim 1, wherein w is 1.6% to 4% and D50 is from 6 μm to 13 μm.

3. The method according to claim 1, wherein the negative active material further comprises one or more of soft carbon, hard carbon, and silicon-based material.

4. A method for designing a negative electrode plate in a last charge battery, the negative electrode plate comprising a negative active material, a conductive additive, and a binder,
   characterized in that the method comprises:
   1) screening a negative active material for a fast charge battery, comprising:
      (1) determining the mass percentage w of active carbon atoms in the negative active material as measured according to the description;
      (2) determining the particle size D50 corresponding to 50% of the cumulative volume percentage of the negative active material, expressed in μm;
      (3) determining the particle size D90 which corresponds to 90% of the cumulative volume percentage of the negative active material, expressed in μm;
      (4) selecting the negative active material in which the mass percentage w is from 1% to 10% and DS50 is from 5 μm to 15 μm;
      D50 and D90 are measured using a laser diffraction particle size distribution measuring instrument according to the laser diffraction method for measuring particle size distribution;
   I) determining the process parameters of the negative electrode plate, comprising:
      (i) dispersing the negative active material obtained from the above screening and an optional auxiliary agent in a solvent to form a uniform negative electrode slurry, followed by coating a negative electrode current collector with the negative electrode slurry, and after drying the coated negative electrode plate, determining the coating weight CW of the negative electrode plate, expressed in mg/cm"; and
      (i1) cold pressing the negative electrode plate obtained from step (i), followed by determining the press density PD of coating on the negative electrode plate (in g/cm*) and the orientation index OI value of the negative electrode plate, wherein the orientation index OI value is measured by using X-ray powder diffractometer according to X-ray diffraction analysis method and lattice parameter determination method of graphite, and calculating according to formula OI=C004/C110, wherein C004 was peak area of 004 characteristic diffraction peak and C110 was peak area of 110 characteristic diffraction peak; and III) determining fast charge performance of the negative electrode plate according to claim 1; and wherein the negative active material of the negative electrode plate comprises one or more of artificial graphite and natural graphite; the weight percentage of graphite material in the negative active material is higher than 90%; and in step ID, the coating weight CW of the negative electrode plate is further controlled in the range of from 5 mg/cm$^2$ to 13 mg/cm$^2$.

5. The method according to claim 4, wherein w in step (4) is from 1.6% to 4% and D50 is from 6 μm to 13 μm.

6. The method according to claim 4, wherein the negative active material of the negative electrode plate further comprises one or more of soft carbon, hard carbon, and silicon-based material.

7. The method according to claim 4, wherein, in step I), the selected negative active material further has a D90 of from 8 μm to 23 μm.

8. The method according to claim 4, wherein, in step I), the selected negative active material further has a D90 of from 10 μm to 18 μm.

9. The method according to claim 4, wherein in step II), the coating weight CW of the negative electrode plate is further controlled in the range of from 8 mg/cm$^2$ to 12 mg/cm$^2$.

10. The method according to claim 4, wherein in step II), the coating weight CW of the negative electrode plate is further controlled in the range of from 8.4 mg/cm$^2$ to 11.1 mg/cm$^2$.

11. The method according to claim 4, wherein in step II), the press density PD of coating on the negative electrode plate is further controlled in the range of from 1.4 g/cm$^3$ to 1.65 g/cm$^3$.

12. The method according to claim 4, wherein in step II), the press density PD of coating on the negative electrode plate is further controlled in the range of from 1.4 g/cm$^3$ to 1.55 g/cm$^3$.

13. The method according to claim 4, wherein in step II), the orientation index OI value of the negative electrode plate is further controlled in the range of from 8 to 30.

14. The method according to claim 4, wherein in step II), the orientation index OI value of the negative electrode plate is further controlled in the range of from 12 to 24.

15. The method according to claim 4, wherein the method further comprises:

IV) changing performance parameters of the negative active material and/or the process parameters of the negative electrode plate to adjust A value, so that the ratio performance of the negative electrode plate meets design requirements.

* * * * *